United States Patent [19]

Hsu

[11] 4,277,884
[45] Jul. 14, 1981

[54] METHOD FOR FORMING AN IMPROVED GATE MEMBER UTILIZING SPECIAL MASKING AND OXIDATION TO ELIMINATE PROJECTING POINTS ON SILICON ISLANDS

[75] Inventor: Sheng T. Hsu, Lawrenceville, N.J.

[73] Assignee: RCA Corporation, New York, N.Y.

[21] Appl. No.: 174,845

[22] Filed: Aug. 4, 1980

[51] Int. Cl.³ .................... H01L 21/205; H01L 21/84
[52] U.S. Cl. ........................................ 29/571; 29/579; 29/580; 148/1.5; 148/175; 148/187; 156/649; 156/653; 156/657; 156/659.1; 430/313; 430/314; 430/317; 357/4; 357/23; 357/54
[58] Field of Search .................... 29/571, 579, 580; 148/1.5, 187, 175; 156/649, 653, 657, 659.1; 430/313, 314, 317; 357/4, 23, 54

[56] References Cited

U.S. PATENT DOCUMENTS

| 3,508,982 | 4/1970 | Shearin | 156/663 X |
|---|---|---|---|
| 3,740,280 | 6/1973 | Ronen | 430/314 |
| 3,890,632 | 6/1975 | Ham et al. | 357/23 |
| 3,958,266 | 5/1976 | Athanas | 357/4 X |
| 4,054,895 | 10/1977 | Ham | 357/23 |
| 4,070,211 | 1/1978 | Harari | 148/187 |
| 4,076,860 | 2/1978 | Kuroda | 430/316 |
| 4,097,314 | 6/1978 | Schlesier et al. | 148/187 X |
| 4,160,260 | 7/1979 | Weitzel et al. | 357/4 X |
| 4,174,217 | 11/1979 | Flatley | 430/317 |
| 4,199,384 | 4/1980 | Hsu | 148/175 X |

OTHER PUBLICATIONS

Ham et al., "Study of Microcircuits by Transmission Electron Microscopy", R.C.A. Review, vol. 38, Sep. 1977, pp. 351-389.

Primary Examiner—R. Dean
Assistant Examiner—W. G. Saba
Attorney, Agent, or Firm—Birgit E. Morris; D. S. Cohen; Lawrence P. Benjamin

[57] ABSTRACT

A novel process is described for forming a gate member for an SOS device wherein the objectionable point that appears at the top of the silicon island is removed. The point results when an anisotropic etch is utilized to form the island. The process includes first forming a relatively thick layer of CVD oxide around sides at the base portion of the island while the remainder of the sides of the island, including the objectionable point, remain exposed for further processing in order to remove the point. The point is then heavily oxidized to form a bird beak which bird beak joins the gate oxide with the CVD oxide to produce a rounded edge.

5 Claims, 9 Drawing Figures

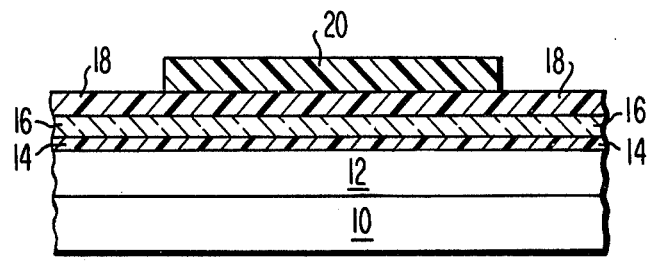
Fig./
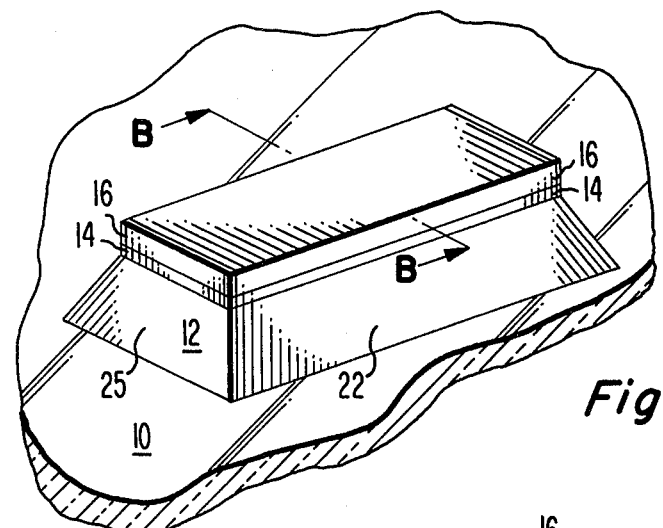
Fig.2A
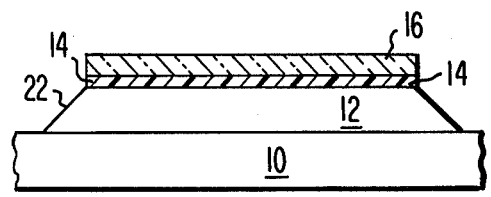
Fig.2B
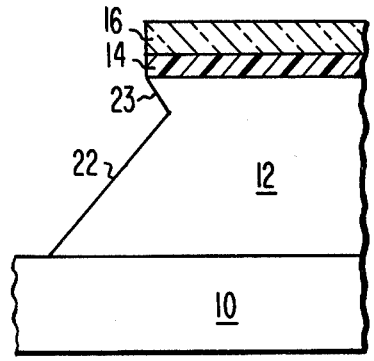
Fig.2C
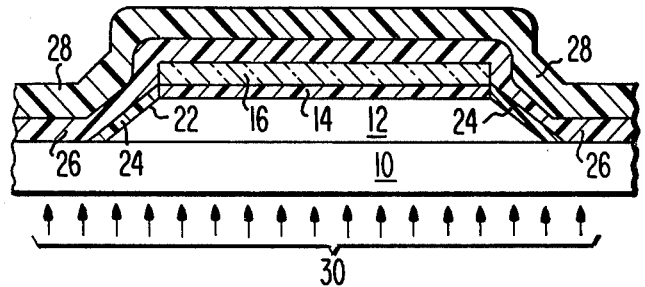
Fig.3

METHOD FOR FORMING AN IMPROVED GATE MEMBER UTILIZING SPECIAL MASKING AND OXIDATION TO ELIMINATE PROJECTING POINTS ON SILICON ISLANDS

BACKGROUND OF THE INVENTION

This invention relates in general to semiconductor processing and, more particularly, to an improved method for processing silicon-on-sapphire semiconductor devices to produce an improved gate structure.

In the normal processing of a silicon-on-sapphire semiconductor device, the classic method of forming the island utilizes an anisotropic etch. This etch is usually done with a potassium hydroxide (KOH) solution which, by its nature, will produce islands havng sloped sides wherein the base of the island is longer and broader than the top surface thereof. However, when this island is utilized to form a semiconductor device without any further treatment, it has been noted that the gate dielectric breakdown voltage is consistently lower than in edgeless devices. The cause of this low gate dielectric breakdown voltage was investigated and found to have occurred at the upper edge of the island where a peak or point was produced as a result of the anisotropic etch. For a more detailed discussion of the structure near the top edge of the island, the reader is directed to an article entitled "The Study of Microcircuits by Transmission Electron Microscopy" by W. E. Ham et al. appearing in RCA Review, Vol. 38, September 1977, pp. 351–389. Particular attention is directed to FIGS. 12-15 wherein a high magnification cross section transmission electron microscopy shows an image of an island edge after an anisotropic etch. It was theorized that the formation of the sharp edge otherwise known as "interface tilt", appearing at the upper edge of the silicon island, also causes the oxide formed around this point to be thinner than that in other parts of the island. Consequently, the low gate breakdown voltage would most likely occur at the top edge adjacent the point.

One method that was tried, in order to remove the objectionable point at the top edge of the silicon island, was to heavily oxidize the side of the island. However, since thermal oxidation of a given volume of silicon produces approximately twice that value of oxide, it will be seen that to produce an oxide thickness of approximately 1000 angstroms, only 500 angstroms of silicon would be oxidized. This would not be enough to remove the objectionable point and in any event would introduce still another discontinuity. A heavy oxidation of this sort would only appear on the side of the silicon island and would provide a noticeable and undesirable separation or lifting of silicon oxide from the sapphire surface.

SUMMARY OF THE INVENTION

In accordance with the teachings of my invention, a novel process is described for forming a gate member for a silicon on sapphire device wherein the objectionable point appearing at the top edge of the silicon island, which point results from the anisotropic etch to form the island, is removed by being heavily oxidized without having the oxide layer separate from the sapphire surface. This is accomplished by first forming a relatively thick chemically vapor deposited layer around only the base of the island, while the remainder of the sides of the island, including the objectionable point, are exposed for the further processing steps which will remove the point. It has been found that this may most conveniently be done using a layer of negative photoresist and exposing the photoresist to radiant energy from the reverse side of the sapphire surface.

BRIEF DESCRIPTION OF THE DRAWING

FIG. 1 is a cross sectional view of a sapphire substrate during the intial stages of processing;

FIG. 2A is a prospective view of a subsequent stage in the processing;

FIG. 2B is a cross section of FIG. 2A taken along lines B—B;

FIG. 2C is an enlarged view of FIG. 2B showing the undesirable tilt projection and point produced at the upper surface of the sapphire island, and FIGS. 3–7 show the various stages of my novel process for forming a semiconductor device.

Figure 4:
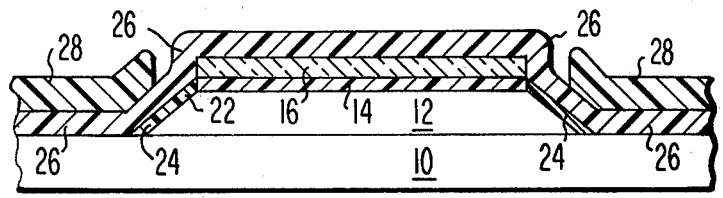

It should be noted that while the foregoing exegesis, with regard to FIGS. 1-7, will be discussed in terms of a silicon-on-sapphire (SOS) device, it should be obvious to those skilled in the art that while sapphire is preferred, other similar insulative substrates such as monocrystalline beryllium oxide and spinel may also be used.

DETAILED DESCRIPTION OF THE INVENTION

Referring now to FIG. 1, there is shown the initial stage of my novel processing wherein an insulative substrate 10 is provided having an appropriate crystallographic orientation sufficient to produce the required orientation of silicon. A layer of silicon 12 is grown in a known manner such as by the thermal decomposition of silane in a hydrogen ambient, in order to produce a layer of monocrystalline silicon having a thickness of about 0.6 $\mu$m. After the desired thickness has been achieved, the silane flow is terminated while the structure is maintained in the hydrogen ambient at a temperature of about 1000 C.$\pm$100 C. in order to anneal the silicon layer and thus reduce any defects that may have been generated during the formation of layer 12. The next step in the process is to provide the exposed surface of silicon layer 12 with a layer of thermally grown silicon oxide ($SiO_2$) 14 having a thickness of about 200–500 angstroms in order to insulate the subsequently formed gate member from the channel region. Thereafter, the structure is provided with a silicon nitride ($Si_3N_4$) layer 16 having a thickness of about 2000–4000 angstroms, in a well known manner, followed by a layer of chemically vapor deposited $SiO_2$ 18 having a thickness of about 3000–4000 angstroms. After forming layers 14, 16 and 18 on the upper surface of silicon layer 12, the structure is now provided with a layer of patterned photoresist 20 with the photoresist remaining in the areas where it is desired to form the islands.

The next step in my novel process requires the formation of the island which is accomplished by utilizing photoresist regions 20 as a mask in order to etch the exposed portions of masking oxide layer 18. This is done with a buffered HF solution. The buffered HF etch will only remove the exposed portions of layer 18 and, it is therefore, necessary to utilize a phosphoric acid solution to etch the now exposed portions of layer 16. Using the layer 16 as a mask, a second buffered HF solution is utilized to etch layer 14 to expose layer 12. Thereafter, the silicon layer 12 is etched down to sapphire substrate 10 using a KOH solution. The net result is the device shown in perspective in FIG. 2A and in cross sections in FIGS. 2B and 2C. Referring now to FIGS. 2A and 2B, there is shown the island 12 formed by the anisotropic etch positioned atop the surface of sapphire substrate 10. The side wall 22 is formed having the portion thereof adjacent the substrate 10 wider than the top portion thereof on which is formed gate oxide 14 and nitride layer 16.

Referring now to FIG. 2C there is shown an enlargement of the side view of FIG. 2b showing the undesirable point 23 formed near the upper surface of island 12.

Referring now to FIG. 3, it will be seen that after the island is formed it is then subjected to a thermal oxidation wherein the exposed surfaces of the island namely, sides 25 (FIG 2A) and 22 are thermally oxidized as well as the other two sides which are not shown in FIG. 2A. This thermally grown layer of oxide 24 is grown to a thickness of about 100–300 angstroms. Thereafter, layer 26 of CVD oxide is deposited over the entire structure including any exposed surface of sapphire substrate 10 to a thickness of about 1500–2500 angstroms and thereafter, the entire structure is covered with a layer of negative photoresist 28.

Figure 5:
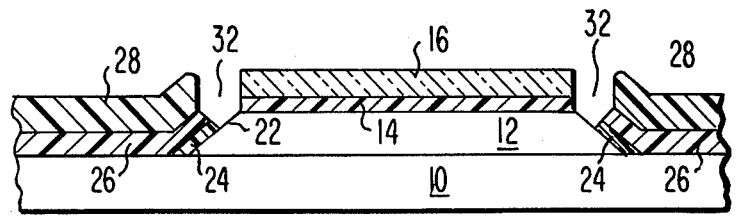

Layer 28 is a radiation responsive substance such as polymerizing photoresist. It should be understood that layers 24 and 26 are made sufficiently thin to allow the transmittance of radiant energy, as shown by arrows 30, with which photoresist coating 28 can react. Additionally, it should be understood that the absorption coefficients of the substrate 10, island 12, as well as layers 24 and 26, are so selected as to allow the energy to be transmitted therethrough but attenuated as it passes through the thicker portion of island 12. This may also be accomplished by adjusting the flux density from source 30 so that no energy will pass through the upper portion of surface 22. Accordingly, the greatest attenuation of energy occurs through the thicker portions of the semiconductor island 12 and the lesser attenuation occurs through the thinner portions of the semiconductor island. Since layer 28 is negatively reacting photoresist, after development thereof those portions of the layer 28 that are not exposed to energy are removed while those portions of layer 28 that are exposed will remain to function as a mask. This is shown in more detail in FIG. 4 where, after having exposed portions of photoresist layer 28 through the back of substrate 10, the unexposed portion of layer 28 are removed to expose the CVD masking oxide layer 26. The structure is now subjected to a buffered HF etch which removes all of the exposed portion of layer 26 as well as portions of the thermally grown oxide layer 24 as shown in FIG. 5. This last etch removes only portions of the oxide layers 24 and 26 appearing on the upper portion side wall 22 adjacent point 23 (FIG. 2C) to produce apertures 32.

Figure 6:
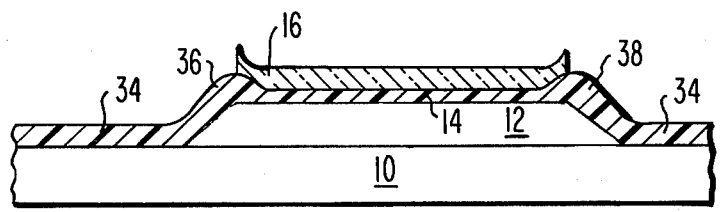
Figure 7:
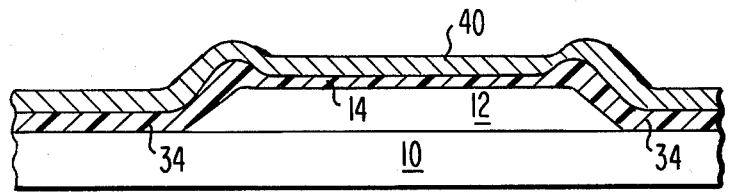

Referring now to FIG. 6, there is shown the structure after negative photoresist layer 28 has been removed and a layer of thermal oxide has been grown in aperture 32 (FIG. 5). It should be noted that since layers 24 and 26 were oxide layers and since an oxide is thermally grown in aperture 32, these layers will be indistinguishable and are therefore given new identifying numeral 34. The thermal oxide 36 and 38 formed in the apertures 32 is grown to a thickness of about 2500–4500 angstroms. However, since very little thermal oxide will be grown on layer 26, bird beak portions 36 and 38 will be produced in apertures 32 (FIG. 5). Bird Beaks 36, 38 consume point 23 (FIG. 2C) and join oxide layers 34 with gate oxide layer 14. As shown in FIG. 7, a layer of polycrystalline silicon 40 is formed over the entire device which layer may subsequently be masked and etched to form a gate member. Any subsequent processing will follow normal techniques in which drain and source regions (not shown) may be formed and respective gate, drain and source contacts (not shown) made thereto.

Thus, what has been described is a novel method for eliminating the objectionable point or "tilt projection" formed during the anisotropic etch of the island. By removing the tilt projection, one is thus able to avoid low breakdown voltages which occur as a result of a thinning of the oxide at the objectionable point.

What I claim is:

1. A process for forming an improved gate structure for a metal-oxide-semiconductor device wherein an island of silicon is formed on an insulating substrate, the island having slanted side walls producing a base surface adjacent the substrate that is broader and longer than the top surface thereof and characterized by the presence of an objectionable projecting point at the upper portion of the side walls adjacent the top surface, comprising the steps of:

forming a layer of gate oxide on the top surface of the island;

forming a masking layer over the layer of gate oxide;

forming a layer of silicon oxide on the side walls of the island;

removing portions of the silicon oxide on the side walls to expose the projecting point;

oxidizing the projecting point to form a bird beak portion extending between and joining the gate oxide with the remaining portions of the silicon oxide;

removing the masking layer to expose the gate oxide layer; and forming a gate member on the exposed layer of gate oxide to extend over the bird beak portion.

2. The process according to claim 1, wherein portions of the silicon oxide formed on the side walls of the island are removed by the following steps:

depositing a negative polymerizing photoresist over the substrate, the side walls and the surface of the masking layer;

exposing the photoresist to radiant energy from the surface of the substrate opposite the surface on which the islands are formed, whereby the greatest attenuation of radiant energy occurs through the top surface portions of the semiconductor island and the lesser attenuation occurs through the substrate portion and through the base surface portions of the semiconductor island; and removing the unexposed portions of the photoresist to expose the silicon oxide adjacent the projecting point.

3. The process according to claim 2, wherein the step of forming a silicon oxide on the side walls of the island comprises: thermally growing a layer of silicon oxide to a thickness of about 100–300 angstroms; and chemically vapor depositing a layer of silicon oxide over the thermally grown layer of silicon oxide to a thickness of about 1500–2500 angstroms.

4. The process according to claim 3, wherein:
the layer of gate oxide is thermally grown silicon oxide having a thickness of about 200–500 angstroms.

5. The method according to claim 4, wherein:
the masking layer is silicon nitride having a thickness of about 2000–4000 angstroms.

* * * * *